United States Patent
Stefanucci et al.

(10) Patent No.: US 12,047,056 B2
(45) Date of Patent: Jul. 23, 2024

(54) CIRCUIT ARRANGEMENT FOR A GATE DRIVE WITH A FEEDBACK RESISTOR

(71) Applicant: ams International AG, Jona (CH)

(72) Inventors: Camillo Stefanucci, Aarau (CH); Vincenzo Leonardo, Wädenswil (CH)

(73) Assignee: AMS INTERNATIONAL AG, Jona (CH)

( * ) Notice: Subject to any disclaimer, the term of this patent is extended or adjusted under 35 U.S.C. 154(b) by 0 days.

(21) Appl. No.: 18/000,950

(22) PCT Filed: Jun. 9, 2021

(86) PCT No.: PCT/EP2021/065461
§ 371 (c)(1),
(2) Date: Dec. 7, 2022

(87) PCT Pub. No.: WO2021/250096
PCT Pub. Date: Dec. 16, 2021

(65) Prior Publication Data
US 2023/0208415 A1 Jun. 29, 2023

(30) Foreign Application Priority Data
Jun. 10, 2020 (EP) .................... 20179287

(51) Int. Cl.
*H03K 17/042* (2006.01)
*H03K 17/0812* (2006.01)
*H03K 17/687* (2006.01)

(52) U.S. Cl.
CPC . *H03K 17/04206* (2013.01); *H03K 17/08122* (2013.01); *H03K 17/6871* (2013.01)

(58) Field of Classification Search
CPC ....... H03K 17/04206; H03K 17/08122; H03K 17/6871
(Continued)

(56) References Cited

U.S. PATENT DOCUMENTS 5,363,065 A  11/1994  Dufour
5,369,309 A  11/1994  Bacrania et al.
(Continued)

FOREIGN PATENT DOCUMENTS

EP  0561456 A1  9/1993
FR  2872648 A1  1/2006

OTHER PUBLICATIONS

Loiseau, Ludovic (PCT Authorized Officer), International Search Report and Written Opinion dated Sep. 23, 2021 in corresponding International Application No. PCT/EP2021/065461 (11 pages).
(Continued)

*Primary Examiner* — William Hernandez
(74) *Attorney, Agent, or Firm* — MH2 TECHNOLOGY LAW GROUP LLP

(57) ABSTRACT

A circuit arrangement is provided where the arrangement of a feedback resistor between a first branch and a second branch enables that a voltage is provided at an output terminal in an efficient way, this means with a high settling speed and a low current consumption. The feedback resistor is arranged between a reference node and the output terminal, where the reference node is connected to a current mirror. The circuit arrangement can be employed as a gate driver. Furthermore, a driver block and a method of driving a circuit arrangement are provided.

15 Claims, 4 Drawing Sheets

(58) Field of Classification Search
USPC .......................................... 327/108, 109, 110
See application file for complete search history.

(56) References Cited

U.S. PATENT DOCUMENTS

| | | | |
|---|---|---|---|
| 6,445,223 B1 * | 9/2002 | Thilenius | G05F 3/262 |
| | | | 327/108 |
| 7,345,543 B2 | 3/2008 | Barou et al. | |
| 2006/0186958 A1 | 8/2006 | Carreto et al. | |
| 2014/0070886 A1 | 3/2014 | Bowers | |

OTHER PUBLICATIONS

Schindler, A. et al. "Gate Driver with 10ns/15ns In-Transition Variable Drive Current and 60% Reduce Current Dip" IEEE, 2016, pp. 325-328.

* cited by examiner

CIRCUIT ARRANGEMENT FOR A GATE DRIVE WITH A FEEDBACK RESISTOR

CROSS-REFERENCE TO RELATED APPLICATIONS

This patent application is the national stage entry of International Patent Application No. PCT/EP2021/065461, filed on Jun. 9, 2021, and published as WO 2021/250096 A1 on Dec. 16, 2021, and claims priority to European patent application 20179287.6 filed on Jun. 10, 2020, the disclosures of all of which are hereby incorporated by reference in their entireties.

FIELD

The present application relates to a circuit arrangement, a driver block and a method of driving a circuit arrangement.

BACKGROUND OF THE INVENTION

In order to drive motors or actuators, gate drivers can be employed to control driving transistors that are connected to the motor or the actuator. The gate drivers can be part of a controller for driving the gates of the transistors. In general, gate drivers can be employed to supply a capacitive load with charge.

In a gate driver in most cases the generation of a voltage level is required in order to avoid that the output voltage of the gate driver is limited by a supply voltage. This can be achieved with additional circuitry which can be expensive and which consumes space.

Furthermore, it is necessary that the output voltage of the gate driver is compatible with the supply voltage. In addition, for most applications an efficient and fast charging of the load is desired.

It is an objective to provide a circuit arrangement that can be operated efficiently. It is further an objective to provide a gate driver that can be operated efficiently. It is further an objective to provide an efficient method of driving a circuit arrangement.

These objectives are achieved by the subject matter of the independent claims. Further developments and embodiments are described in dependent claims.

SUMMARY OF THE INVENTION

According to at least one embodiment of the circuit arrangement, the circuit arrangement comprises a first branch and a second branch. The first branch and the second branch can each be electrically conductive. The expression "branch" refers to a path within the circuit arrangement. For example, the first branch and the second branch are each a current path within the circuit arrangement. Within the first branch and the second branch one or more components of the circuit arrangement can be arranged, respectively. This means, the first branch and the second branch are each an electrically conductive path within the circuit arrangement. The first branch and the second branch can be arranged parallel to each other.

The circuit arrangement further comprises a current source arranged in the first branch. The current source can be a controllable current source. The current source can comprise a further current mirror. The current source can be configured to supply electrical current to the first branch.

The circuit arrangement further comprises a current mirror to mirror a current of the first branch in the second branch. This means, the first branch is connected to the second branch at least via the current mirror. The current mirror can comprise a component that is arranged within the first branch and a further component that is arranged within the second branch.

The circuit arrangement further comprises a first transistor arranged in the second branch. The first transistor is not comprised by the current mirror. The first transistor is connected to the current mirror.

The circuit arrangement further comprises a reference element arranged in the first branch. The reference element can be a resistor.

The circuit arrangement further comprises a reference node of the first branch being arranged between the current mirror and the reference element. The reference node can be connected to the current mirror. The reference node can also be connected to the reference element.

The circuit arrangement further comprises an output terminal being connected to an internal node of the second branch, the internal node being arranged between the current mirror and the first transistor. The output terminal can be configured to be connected to external devices. For example, the output terminal can be configured to be connected to an external load. The external load can be a capacitive load.

The current mirror comprises a reference transistor and a second transistor. The reference transistor can be connected to the second transistor. The reference transistor can be connected to the current source. The second transistor can be connected to the internal node of the second branch. The second transistor can be larger than the reference transistor. The larger the second transistor is, the larger is the current that the second transistor can provide. Therefore, the size of the second transistor can be chosen depending on the current required at the output terminal. The second transistor can be matched with the reference transistor. This can mean, that the reference transistor and the second transistor are the same types of transistors. The reference transistor and the second transistor can further have similar geometrical properties. The first transistor can also be of the same type of transistor as the reference transistor and the second transistor.

A feedback resistor is arranged between the internal node of the second branch and the reference node. The feedback resistor is connected to the internal node of the second branch and to the reference node. This means, the feedback resistor is connected between the internal node of the second branch and with the reference node. The feedback resistor is arranged between the first branch and the second branch. A diode can be connected between the control terminal of the second transistor and the feedback resistor for ESD purposes. The control terminal of the second transistor can be a gate terminal.

The described circuit arrangement can be employed to supply a current or a voltage at the output terminal. The output terminal can either be pulled down to a first voltage level with the first transistor or the output terminal can be pulled up to a driving voltage. For this purpose, a current is provided by the current source in the first branch. This current is mirrored to the second branch and thus to the output terminal by the second transistor of the current mirror. The voltage provided by the second transistor is obtained by allowing the current provided by the current source to flow through the reference element. The voltage drop over the reference element defines the voltage provided by the second transistor to the output terminal. This means, the voltage drop over the reference element defines the driving voltage provided at the output terminal. The voltage level at the reference node is mirrored by the current mirror. Thus, for providing the driving voltage at the output terminal it is necessary to establish the driving voltage at the reference node. This is achieved by providing a current by the current source and by allowing this current to flow through the reference element.

The settling speed for providing the driving voltage at the output terminal depends on the settling speed of the driving voltage. This settling speed depends on the current provided by the current source and the total parasitic capacitance on the reference node in the first branch. During the time when charge is provided to the output terminal the feedback resistor couples its impedance to the reference node and thus reduces the impedance of the reference node. If the output terminal is connected to a capacitive load the feedback resistor reduces the output impedance during charging of the capacitive load. A reduced output impedance of the circuit arrangement enables a faster settling speed of the driving voltage. This allows an increased charging speed of the capacitive load. The effect of the reduced impedance progressively reduces the closer the voltage provided at the output terminal is to the driving voltage. When the voltage provided at the output terminal reaches the value of the driving voltage the impedance of the circuit arrangement is higher than the impedance of the feedback resistor. Thus, the feedback resistor enables an increased settling speed during the charging process. This means, the feedback resistor enables an efficient operation of the circuit arrangement.

Since the settling speed for providing the driving voltage at the output terminal depends on the current provided by the current source and thus on the current provided by the second transistor, the size of the second transistor can be chosen with respect to speed requirements for providing the driving voltage.

Once the capacitive load is completely charged the second transistor will switch off. In this case a current is provided to the second transistor via the feedback resistor. This current through the feedback resistor thus controls the second transistor. In this way the second transistor keeps the voltage level at the output terminal close to the driving voltage. This means the voltage level at the output terminal is kept stable. With this current reuse the circuit arrangement is very power efficient since only a small current provided by the current source is consumed. However, if more charge is required at the output terminal due to a voltage drop, the second transistor is able to provide the required charge based on the voltage provided by the reference transistor along with the current of the current source so that still the voltage level of the driving voltage is provided at the output terminal. During this further charging by the second transistor the impedance is reduced again because of the feedback resistor. Thus, the settling speed is increased and the voltage provided at the output terminal quickly increases to the driving voltage again. Consequently, the feedback resistor enables a fast charging process and thus an efficient operation of the circuit arrangement. Furthermore, the voltage provided at the output terminal can be kept stable since the circuit arrangement quickly reacts on disturbances. This reaction speed is not achieved by additional controls or switches but is an intrinsic property of the circuit arrangement.

The setup of the circuit arrangement with the feedback resistor therefore enables a faster settling speed of the driving voltage at the output terminal and a low current consumption after this charging process. To enable these features no further control for regulating the supply of the driving voltage at the output terminal is required. These two features lead to an efficient operation of the circuit arrangement.

The setup of the circuit arrangement furthermore has the advantage that no additional circuitry, no further external components and no voltage regulator are required for the generation of a voltage level. These additional components would add complexity and size to the circuit arrangement which is avoided here. Instead, the voltage level of the driving voltage is obtained by allowing the current provided by the current source to flow through the reference element.

According to at least one embodiment of the circuit arrangement, the reference transistor is arranged in the first branch and the second transistor is arranged in the second branch. This means, the reference transistor is electrically connected to the first branch and the second transistor is electrically connected to the second branch. This arrangement enables that a current provided by the current source to the reference transistor is mirrored to the second transistor.

According to at least one embodiment of the circuit arrangement, a first terminal of the first transistor and a first terminal of the second transistor are connected to the internal node of the second branch. The first terminal of the first transistor can be the drain terminal of the first transistor. The first terminal of the second transistor can be the source terminal of the second transistor. With this arrangement of the first transistor and the second transistor, the output terminal can be either pulled down to the first voltage level with the first transistor or the output terminal can be pulled up to the driving voltage with the second transistor.

According to at least one embodiment of the circuit arrangement, a control terminal of the reference transistor is connected to a control terminal of the second transistor. The control terminal of the reference transistor can be the gate terminal of the reference transistor. The control terminal of the second transistor can be the gate terminal of the second transistor. In this way, the reference transistor and the second transistor form the current mirror.

According to at least one embodiment of the circuit arrangement, the current source is connected to a first terminal and a control terminal of the reference transistor. The first terminal of the reference transistor can be the drain terminal of the reference transistor. With this connection the current source can provide current to the current mirror.

According to at least one embodiment of the circuit arrangement, a second terminal of the reference transistor is connected to the reference node of the first branch. The second terminal of the reference transistor can be the source terminal of the reference transistor. This connection allows a current provided by the current source to flow through the reference element.

According to at least one embodiment of the circuit arrangement, a control terminal of the first transistor is connected to a voltage control circuit and the current source is connected to a control block. The control terminal of the first transistor can be the gate terminal of the first transistor. The voltage control circuit can be configured to control the voltage applied to the control terminal of the first transistor. The control block can be configured to control the current provided by the current source. The voltage control circuit and the control block can be connected to each other. The voltage control circuit and the control block can be operated inverted with respect to each other. This can mean, that either a voltage is applied to the control terminal on the first transistor or the current source provides a current. This arrangement enables that the output terminal can either be pulled down to the first voltage level with the first transistor or the output terminal can be pulled up to the driving voltage.

According to at least one embodiment of the circuit arrangement, the first branch and the second branch are each arranged between a first power rail and a second power rail. The first power rail can be at a first voltage level. The second power rail can be at a second voltage level. The second voltage level can be higher than the first voltage level. The first power rail and the second power rail are each a supply line.

According to at least one embodiment of the circuit arrangement, the reference element and a second terminal of the first transistor are connected to the first power rail, and the current source and a second terminal of the second transistor are connected to the second power rail. The second terminal of the first transistor can be the source terminal of the first transistor. The second terminal of the second transistor can be the drain terminal of the second transistor. With this arrangement the first branch and the second branch are each arranged between the first power rail and the second power rail.

According to at least one embodiment of the circuit arrangement, the reference element comprises a mirror resistor, connected to the reference node of the first branch and to the first power rail. The mirror resistor enables that the voltage drop over the reference element defines the voltage provided by the second transistor to the output terminal.

According to at least one embodiment of the circuit arrangement, the first transistor, the second transistor and the reference transistor are each an n-type metal-oxide-semiconductor transistor, a p-type metal-oxide-semiconductor transistor, a NPN bipolar transistor or a PNP bipolar transistor. This means, the first transistor, the second transistor and the reference transistor are of the same type of transistor. These types of transistors enable an efficient operation of the circuit arrangement.

Furthermore, a driver block is provided. The driver block comprises at least one circuit arrangement described herein. The driver block can be a gate driver, for example for motor controllers. It is further possible that the driver block is a driver for external field effect transistors or that the driver block is a capacitive load driver. Comprising the circuit arrangement, the driver block can be operated efficiently. The driver block shows a fast settling speed of the driving voltage at the output terminal and a low current consumption after the charging process. The driver block can be employed to drive motors or actuators. For example, the driver block can be configured to drive a gate or gates of an external driver or external drivers for a motor or an actuator.

According to at least one embodiment of the driver block, the driver block comprises at least two circuit arrangements, wherein the first transistor, the second transistor and the reference transistor of a first one of the at least two circuit arrangements are each an n-type metal-oxide-semiconductor transistor or a NPN bipolar transistor, and the first transistor, the second transistor and the reference transistor of a second one of the at least two circuit arrangements are each a p-type metal-oxide-semiconductor transistor or a PNP bipolar transistor. The driver block can comprise one or more output terminals. The driver block can be configured to either pull down the first one of the output terminals to the first voltage level or to pull up the first one of the output terminals to the driving voltage. The driver block can further be configured to either pull down the second one of the output terminals to the driving voltage or to pull up the second one of the output terminals to the second voltage level. The first voltage level can be the voltage level of a ground potential. The second voltage level can be a battery voltage level of a battery. Therefore, by employing a first circuit arrangement with a first polarity of the transistors and a second circuit arrangement with a second polarity of the transistors, the driver block can be employed to control a half-bridge of a motor or actuator.

Furthermore, a method of driving a circuit arrangement is provided. The circuit arrangement can preferably be employed for the method of driving a circuit arrangement described herein. This means all features disclosed for the circuit arrangement are also disclosed for the method of driving a circuit arrangement and vice-versa.

According to at least one embodiment of the method of driving a circuit arrangement, the method comprises providing a current by a current source to a current mirror, wherein the current source is arranged in a first branch. The current source can be controlled by a control block connected to the current source.

The method further comprises employing the current mirror to mirror a current of the first branch in a second branch, wherein an internal node of the second branch is connected to an output terminal. The current mirrored from the first branch in the second branch by the current mirror is provided at the output terminal. This is a first mode of operation of the circuit arrangement.

The method further comprises employing a first transistor to pull the output terminal to a voltage level of a power rail. In this second mode of operation of the circuit arrangement the voltage level of the power rail is provided to the output terminal via the first transistor. The voltage level can be the first voltage level or the second voltage level. The power rail can be the first power rail or the second power rail.

The first transistor is arranged in the second branch. The internal node of the second branch is arranged between the current mirror and the first transistor. The current mirror comprises a reference transistor and a second transistor. A reference element is arranged in the first branch. A reference node of the first branch is arranged between the current mirror and the reference element. A feedback resistor is arranged between the internal node of the second branch and the reference node.

In the first mode of operation of the circuit arrangement the current source is switched on. This means, the current source provides a current to the first branch. The current flows through the reference element. In this way, a voltage level is established at the reference node. This voltage level is the driving voltage. The current mirror mirrors the current provided at the reference node to the internal node of the second branch. Therefore, the current is provided at the output terminal. The voltage level at the output terminal is determined by the driving voltage. The first transistor is non-conductive in the first mode of operation. In this mode of operation charge is supplied to the output terminal. Thus, for example a capacitive load can be loaded. The settling speed for loading the capacitive load is optimized because of the arrangement of the feedback resistor. Furthermore, once the capacitive load is charged the current consumption is low. This means, only a small current needs to be provided by the current source. This makes the method of driving a circuit arrangement efficient. Moreover, no additional circuitry, no external components and no voltage regulator are required for the generation of a voltage level.

In the second mode of operation of the circuit arrangement the output terminal is pulled down to the first voltage level by the first transistor connected to the first power rail. In this mode of operation the first transistor is conductive.

The current source does not provide a current to the current mirror or only provides a small current to the current mirror. With these two modes of operation a control terminal of a transistor driving a motor or actuator can be controlled.

According to at least one embodiment of the method a voltage control circuit connected to a control terminal of the first transistor is operated inverted with respect to a control block connected to the current source. That the voltage control circuit is operated inverted with respect to the control block can mean, that the voltage control circuit causes the first transistor to be conductive when the control block causes the current source to provide no current or nearly no current. Furthermore, the voltage control circuit causes the first transistor to be nonconductive when the control block causes the current source to provide a current. This means, the voltage control circuit causes the first transistor to operate in two different states, namely a conductive state and a nonconductive state. The control block causes the current source to operate in two different states namely, a state of providing no current or nearly no current and a state of providing a current. The voltage control circuit can be coupled to the control block in order to enable the inverted operation. In this way, the two modes of operation of the circuit arrangement are enabled.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

Figure 4:
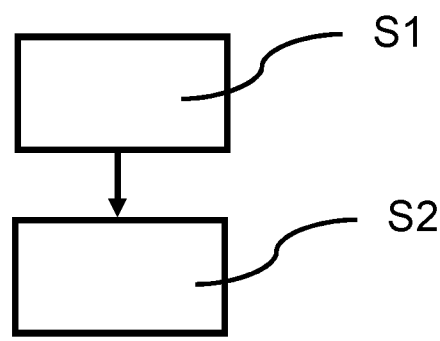

With FIG. 4 an exemplary embodiment of the method of driving a circuit arrangement is described.

Figure 5:
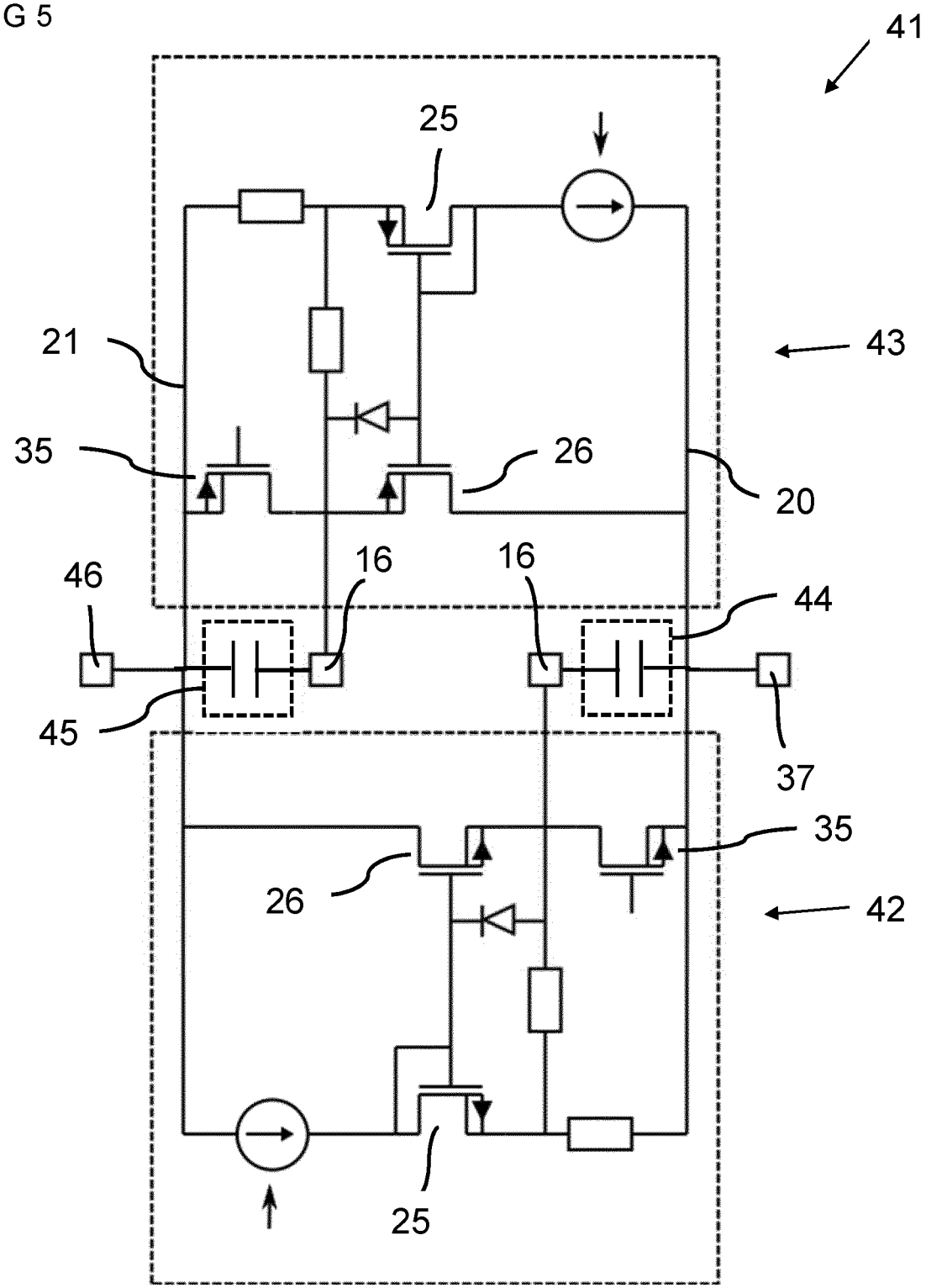

FIG. 5 shows an exemplary embodiment of the driver block.

Figure 6:
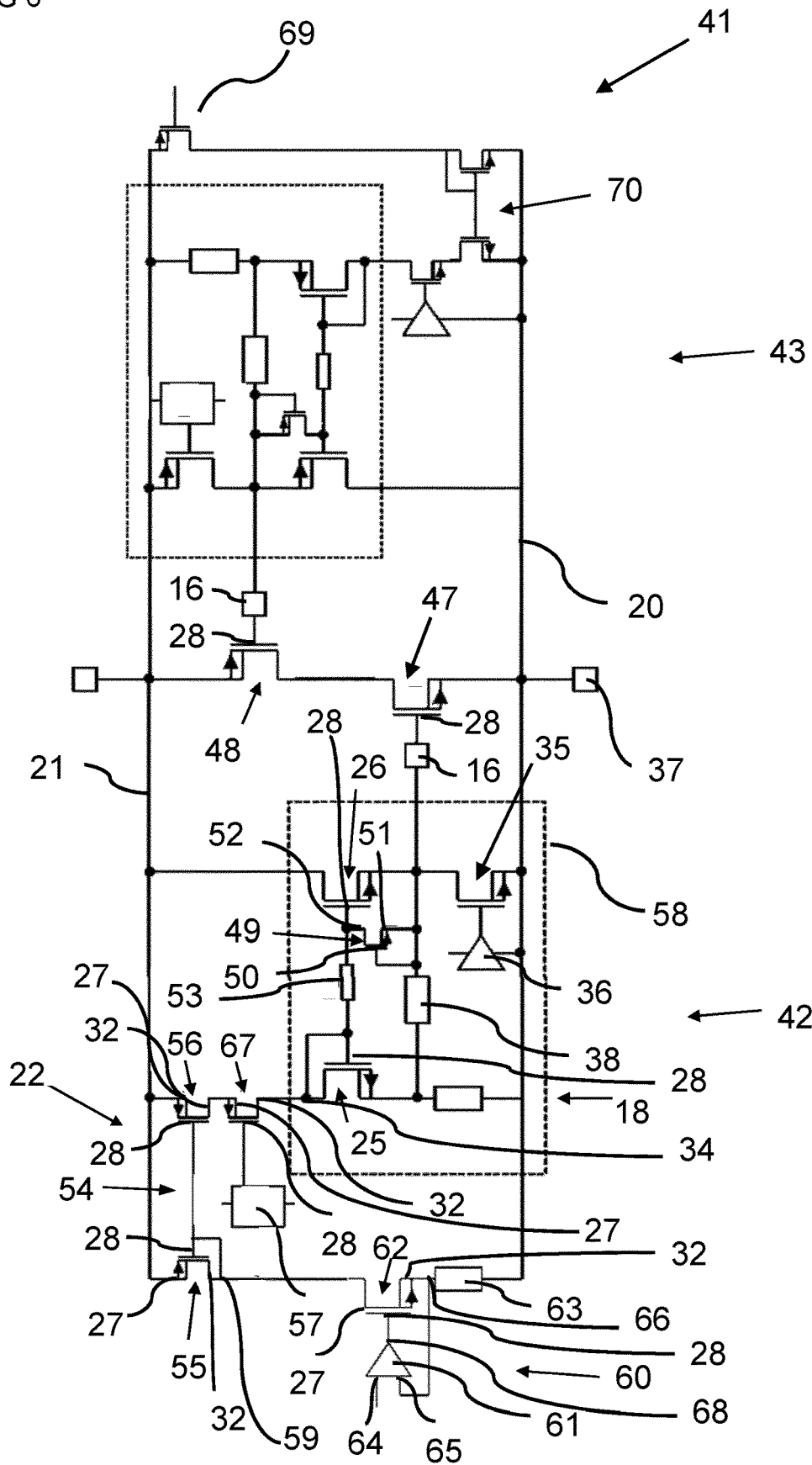

FIG. 6 shows an exemplary embodiment of two circuit arrangements.

DETAILED DESCRIPTION

Figure 1:
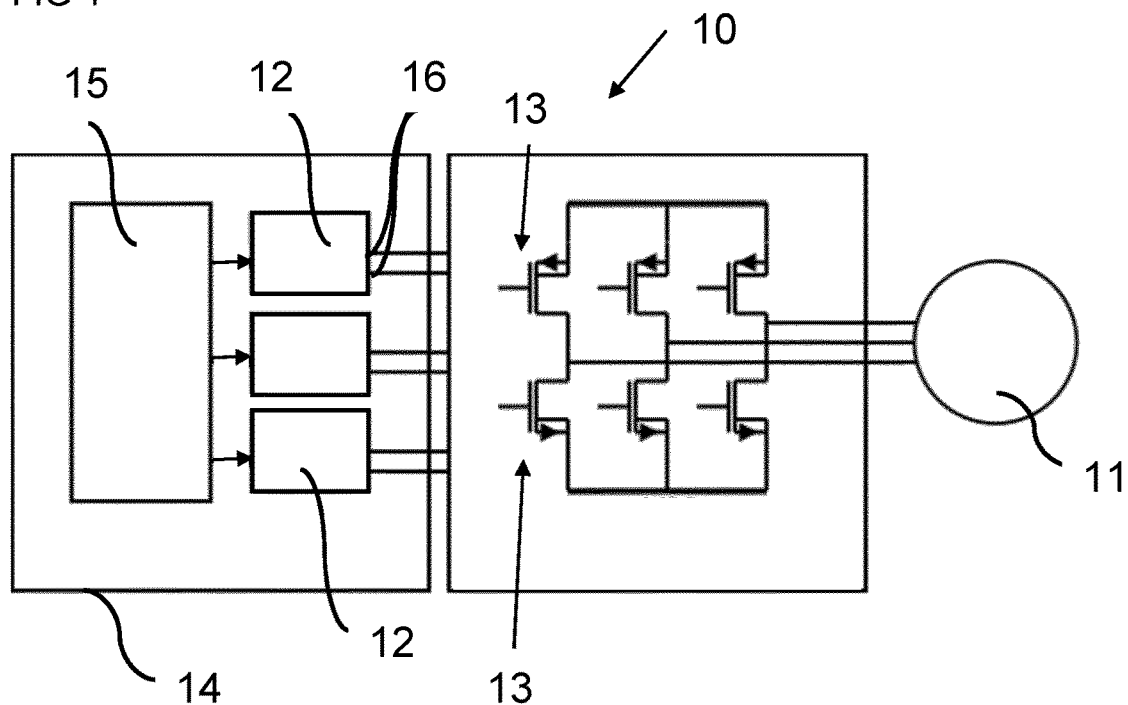
FIG. 1 shows a driver for a load with gate drivers.

FIG. 1 shows a driver 10 for a load 11 with gate drivers 12. The load 11 can be a motor or an actuator. The load 11 is driven by external field effect transistors 13 connected to the load 11. The external field effect transistors 13 are comprised by the driver 10. The driver 10 further comprises a controller 14. The controller 14 comprises a control unit 15 that is connected to the gate drivers 12. Each gate driver 12 comprises two output terminals 16. Each of the output terminals 16 is connected with one of the field effect transistors 13. Pairs of two field effect transistors 13 each form a half-bridge for driving the load 11. The field effect transistors 13 can be power MOSFETs. In this way, the field effect transistors 13 are able to provide the required power to the load 11. The controller 14 is required in order to control the external field effect transistors 13. The gate drivers 12 are required to provide enough charge in order to control the field effect transistors 13. Furthermore, it is desired that the gate drivers 12 can provide the charge within a short time.

Figure 2:
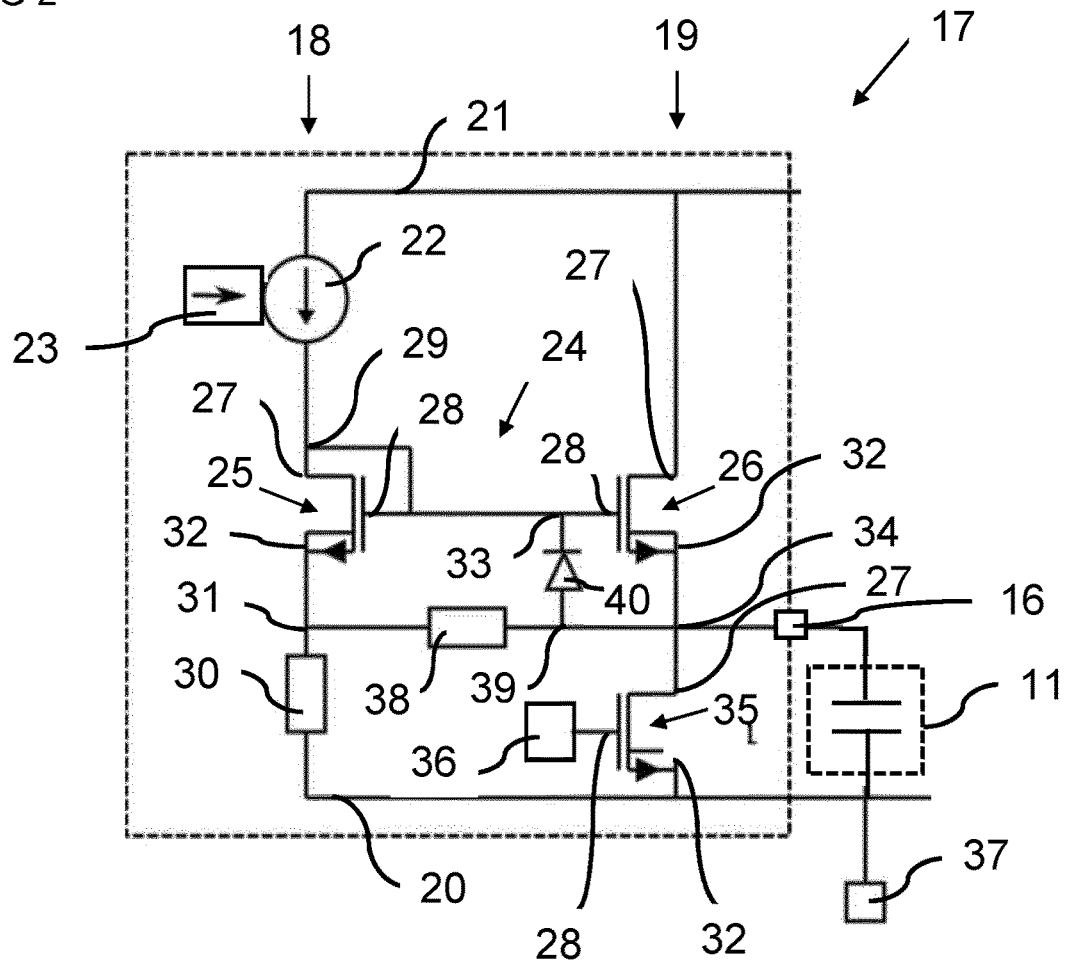
FIG. 2 shows an exemplary embodiment of the circuit arrangement.

In FIG. 2 an exemplary embodiment of the circuit arrangement 17 is shown. The circuit arrangement 17 comprises a first branch 18 that is arranged parallel to a second branch 19 of the circuit arrangement 17. The first branch 18 and the second branch 19 are each arranged between a first power rail 20 and a second power rail 21. The first power rail 20 is at a first voltage level and the second power rail 21 is at a second voltage level.

The circuit arrangement 17 further comprises a current source 22 arranged in the first branch 18. The current source 22 is connected to a control block 23. The current source 22 is further connected to the second power rail 21. The circuit arrangement 17 further comprises a current mirror 24 to mirror a current of the first branch 18 in the second branch 19. The current mirror 24 is connected to the current source 22. The current mirror 24 comprises a reference transistor 25 and a second transistor 26. The reference transistor 25 is arranged in the first branch 18. The current source 22 is connected to a first terminal 27 of the reference transistor 25 and to a control terminal 28 of the reference transistor 25. For this purpose the current source 22 is connected to an upper internal node 29 of the first branch 18. The first terminal 27 and the control terminal 28 of the reference transistor 25 are connected to the upper internal node 29 as well.

The circuit arrangement 17 further comprises a reference element 30 arranged in the first branch 18. A reference node 31 of the first branch 18 is arranged between the current mirror 24 and the reference element 30. A second terminal 32 of the reference transistor 25 is connected to the reference node 31 of the first branch 18. The reference element 30 is connected to the first power rail 20. This means, the reference element 30 is arranged between the first power rail 20 and the reference node 31. The reference element 30 comprises a mirror resistor that is connected to the reference node 31 of the first branch 18 and to the first power rail 20.

The second transistor 26 is arranged in the second branch 19. The control terminal 28 of the reference transistor 25 is connected to a control terminal 28 of the second transistor 26. For this purpose, the control terminal 28 of the second transistor 26 is connected to a first intermediate node 33 that is arranged between the first branch 18 and the second branch 19. The control terminal 28 of the reference transistor 25 is connected to the first intermediate node 33 as well. Furthermore, the first intermediate node 33 is connected to the upper internal node 29. A second terminal 32 of the second transistor 26 is connected to the second power rail 21. A first terminal 27 of the second transistor 26 is connected to an internal node 34 of the second branch 19.

The circuit arrangement 17 further comprises a first transistor 35 arranged in the second branch 19. The internal node 34 of the second branch 19 is arranged between the current mirror 24 and the first transistor 35. A first terminal 27 of the first transistor 35 is connected to the internal node 34. A control terminal 28 of the first transistor 35 is connected to a voltage control circuit 36. A second terminal 32 of the first transistor 35 is connected to the first power rail 20.

The circuit arrangement 17 further comprises an output terminal 16 that is connected to the internal node 34 of the second branch 19. The output terminal 16 can be connected to an external capacitive load 11. The capacitive load 11 can be connected to the output terminal 16 and to the first power rail 20. The first power rail 20 is connected to a ground potential 37.

The circuit arrangement 17 further comprises a feedback resistor 38 that is arranged between the internal node 34 of the second branch 19 and the reference node 31. The feedback resistor 38 is connected to a second intermediate node 39 and to the reference node 31. A diode 40 may be arranged between the first intermediate node 33 and the second intermediate node 39 for ESD protection purposes.

The first transistor 35, the second transistor 26 and the reference transistor 25 can each be an n-type metal-oxide-semiconductor transistor, a p-type metal-oxide-semiconductor transistor, a NPN bipolar transistor or a PNP bipolar transistor.

During operation of the circuit arrangement 17 a current provided by the current source 22 is mirrored to the second branch 19 by the current mirror 24. In this way, the load 11 connected to the output terminal 16 can be loaded. Once the voltage level at the output terminal 16 reached the driving voltage, a direct current path is present between the feedback resistor 38 and the first terminal 27 of the second transistor 26. With this current, the voltage level at the output terminal 16 is kept constant. With this current reuse, the current consumption is kept small during this mode of operation.

With the circuit arrangement 17 described herein a voltage level can be provided in a short time. Advantageously, no charge pumps or dedicated voltage regulators are required.

Figure 3:
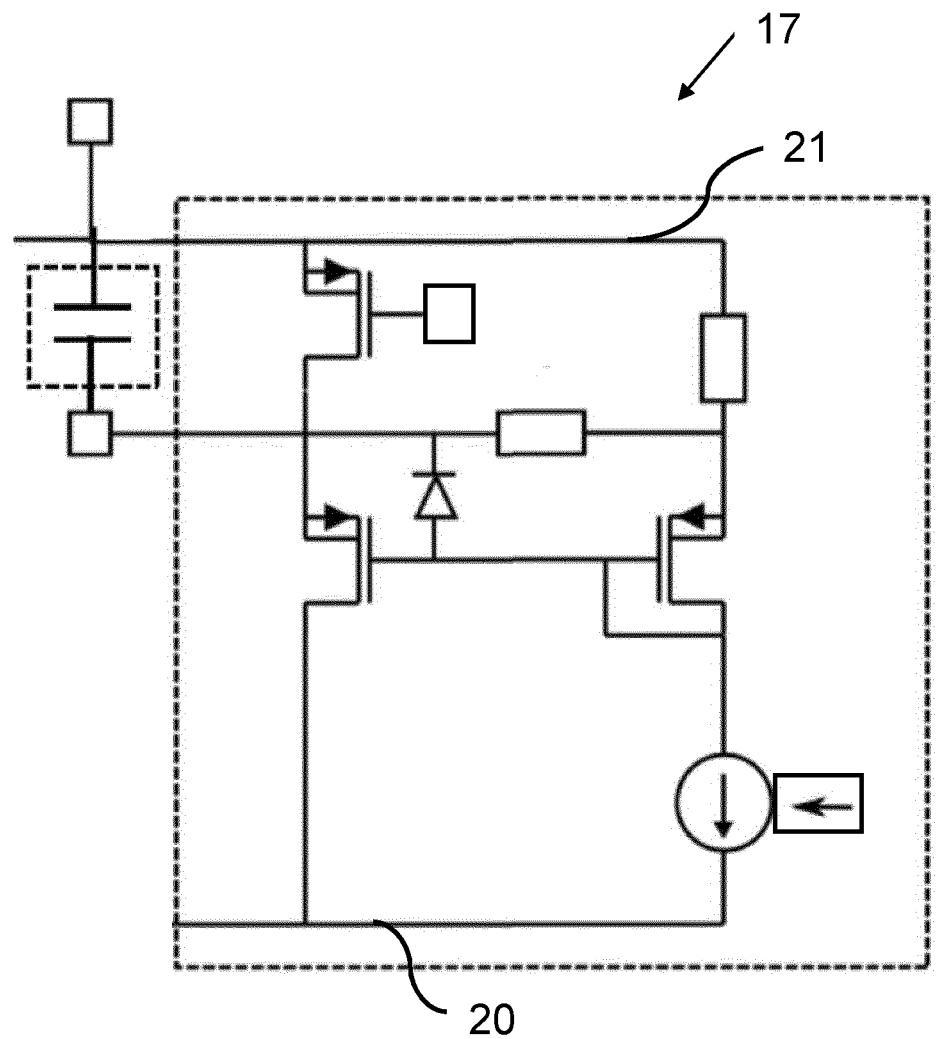
FIG. 3 shows a further exemplary embodiment of the circuit arrangement.

FIG. 3 shows another exemplary embodiment of the circuit arrangement 17. The circuit arrangement 17 has the same setup as the circuit arrangement 17 shown in FIG. 2 mirrored with respect to the first power rail 20 and the second power rail 21. This means, the first power rail 20 and the second power rail 21 are exchanged with respect to the circuit arrangement 17 of FIG. 2. The transistors of the circuit arrangement 17 are of the inverted polarity in comparison to the transistors of the circuit arrangement 17 shown in FIG. 2.

As illustrated in FIG. 4, the circuit arrangement 17 can be operated for driving a voltage at the output terminal (step S1) and for discharging the output terminal (step S2).

FIG. 5 shows an exemplary embodiment of the driver block 41. The driver block 41 comprises two circuit arrangements 17. The circuit arrangement 17 at the top has the setup shown in FIG. 3. The circuit arrangement 17 at the bottom has the setup shown in FIG. 2. The two circuit arrangements 17 are rotated by 90° in comparison to FIGS. 2 and 3. The circuit arrangement 17 with the setup of FIG. 2 is referred to as the first circuit arrangement 42. The circuit arrangement 17 with the setup of FIG. 3 is referred to as the second circuit arrangement 43. The first circuit arrangement 42 and the second circuit arrangement 43 comprise the same first power rail 20 and the same second power rail 21. This means, the first circuit arrangement 42 and the second circuit arrangement 43 are connected to each other via the first power rail 20 and the second power rail 21. The output terminal 16 of the first circuit arrangement 42 is connected to a first load 44. The first load 44 is arranged between the output terminal 16 and a ground potential 37. The output terminal 16 of the second circuit arrangement 43 is connected to a second load 45. The second load 45 is arranged between the output terminal 16 and a further potential 46, for example a battery with a battery voltage level. The ground potential 37 can be a negative supply and the further potential 46 can be a positive supply. The driver block 41 is configured to drive the two loads 44, 45 connected to the output terminals 16. The two load 44, 45 can be capacitive loads.

The first transistor 35, the second transistor 26 and the reference transistor 25 of the first circuit arrangement 42 are each an n-type metal-oxide-semiconductor transistor or a NPN bipolar transistor. The first transistor 35, the second transistor 26 and the reference transistor 25 of the second circuit arrangement 43 are each a p-type metal-oxide-semiconductor transistor or a PNP bipolar transistor. This means, the driver block 41 comprises two circuit arrangements 17 where the first one has an n-type configuration and the second one has a p-type configuration.

FIG. 6 shows an exemplary embodiment of two circuit arrangements 42, 43. The two circuit arrangements 42, 43 are connected to each other in the same way as shown in FIG. 5. The two circuit arrangements 42, 43 together can form a driver block 41.

In this embodiment each of the two loads 44, 45 (shown in FIG. 5) that the circuit arrangements 42, 43 are connected to is a field effect transistor 47, 48. The output terminal 16 of the first circuit arrangement 42 is connected to a control terminal 28 of the first field effect transistor 47. The output terminal 16 of the second circuit arrangement 43 is connected to a control terminal 28 of the second field effect transistor 48. The two field effect transistors 47, 48 can be employed to drive a motor or an actuator as shown in FIG. 1. This means, the two circuit arrangements 42, 43 can be comprised by an external gate driver 12. The two circuit arrangements 42, 43 are configured to turn on and off the two field effect transistors 47, 48, respectively.

The first circuit arrangement 42 which is arranged in the bottom part of FIG. 6 comprises a circuit portion 58 which has nearly the same setup as shown in FIG. 2 without including current source 22. This circuit portion 58 is surrounded by a dashed line. In this part the only difference to the setup shown in FIG. 2 is that the diode 40 is replaced by a protection transistor 49 which can be a field effect transistor. The gate terminal 50 and the source terminal 51 of the protection transistor 49 are connected to the feedback resistor 38. The drain terminal 52 of the protection transistor 49 is connected to the control terminal 28 of the second transistor 26. Furthermore, an additional resistor 53 is arranged between the control terminal 28 of the reference transistor 25 and the control terminal 28 of the second transistor 26. The additional resistor 53 improves the electromagnetic compatibility.

The current source 22 comprises a further current mirror 54. The further current mirror 54 comprises a third transistor 55 and a fourth transistor 56. A fifth transistor 67 acts as a switch for the further current mirror 54. The fourth and the fifth transistor 56, 67 are arranged in the first branch 18. A first terminal 27 of the fourth transistor 56 is connected to the second power rail 21. The first terminal 27 of the fourth transistor 56 can be a source terminal 51. A second terminal 32 of the fourth transistor 56 is connected to a first terminal 27 of the fifth transistor 67. The second terminal 32 of the fourth transistor 56 can be a drain terminal 52. The first terminal 27 of the fifth transistor 67 can be a source terminal 51. A second terminal 32 of the fifth transistor 67 is connected to the internal node 34. The second terminal 32 of the fifth transistor 67 can be a drain terminal 52. This means, the fifth transistor 67 is connected to the reference transistor 25. A control terminal 28 of the fifth transistor 67 can be connected to a level shifter 57. The control terminal 28 of the fifth transistor 67 can be a gate terminal 50. The level shifter 57 can be configured to control the fifth transistor 67. The level shifter 57 is required when the battery voltage level is significantly higher than the voltage level of the ground potential 37. In this case, the voltage control circuit 36 connected to the first transistor 35 comprises a buffer which is connected to the first power rail 20. The fifth transistor 67 can be a p-type metal-oxide-semiconductor transistor or a PNP bipolar transistor.

A control terminal 28 of the fourth transistor 56 is connected to a control terminal 28 of the third transistor 55. The control terminals 28 can be gate terminals 50. A first terminal 27 of the third transistor 55 is connected to the second power rail 21. The first terminal 27 of the third transistor 55 can be a source terminal 51. A second terminal 32 of the third transistor 55, the control terminal 28 of the third transistor 55 and the control terminal 28 of the fourth transistor 56 are connected to a fourth intermediate node 59. The second terminal 32 of the third transistor 55 can be a drain terminal 52.

The current source 22 is supplied with a reference current. Therefore, a reference current source 60 is connected to the current source 22. The reference current source 60 comprises an amplifier 61, a sixth transistor 62 and a reference resistor 63. An output 68 of the amplifier 61 is connected to a control terminal 28 of the sixth transistor 62. The control terminal 28 of the sixth transistor 62 can be a gate terminal 50. A first terminal 27 of the sixth transistor 62 is connected to the further current source 22. For this purpose the first terminal 27 of the sixth transistor 62 is connected to the fourth intermediate node 59. The first terminal 27 of the sixth transistor 62 can be a drain terminal 52. A reference voltage is provided to a first input 64 of the amplifier 61. A second terminal 32 of the sixth transistor 62 is connected to a fifth intermediate node 66. The second terminal 32 of the sixth transistor 62 can be a source terminal 51. A second input 65 of the amplifier 61 is connected to the fifth intermediate node 66. Furthermore, the reference resistor 63 is connected to the fifth intermediate node 66. The reference resistor 63 is arranged between the fifth intermediate node 66 and the first power rail 20. The reference resistor 63 can be matching with the mirror resistor. In this way, advantageously the voltage level provided at the output terminal 16 is constant over process and temperature variations.

The second circuit arrangement 43 shown in FIG. 6 comprises a circuit portion 70 with the setup as described with FIG. 3 surrounded by dashed lines and the further components as described with respect to the first circuit arrangement 42. However, the second circuit arrangement 43 has an opposite configuration in comparison to the first circuit arrangement 42. This means, the second circuit arrangement 43 is mirrored with respect to the first and the second power rail 20, 21. Furthermore, the circuit arrangement 43 comprises current source 70 having a different configuration in comparison to current source 22 of circuit arrangement 42, as shown in FIG. 6. A control terminal of transistor 69 is connected to control terminal 28 of transistor 55.

All electrical connections described herein can be direct connections. In a direct connection no other components are arranged between the two directly connected components.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art. The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

The invention claimed is:

1. A circuit arrangement comprising:
a first branch and a second branch,
a current source arranged in the first branch,
a current mirror to mirror a current of the first branch in the second branch,
a first transistor arranged in the second branch,
a reference element arranged in the first branch,
a reference node of the first branch being arranged between the current mirror and the reference element, and
an output terminal being connected to an internal node of the second branch, the internal node being arranged between the current mirror and the first transistor, wherein
the current mirror comprises a reference transistor and a second transistor, and
a feedback resistor is arranged between the internal node of the second branch and the reference node.

2. The circuit according to claim 1, wherein the reference transistor is arranged in the first branch and the second transistor is arranged in the second branch.

3. The circuit according to claim 1, wherein a first terminal of the first transistor and a first terminal of the second transistor are connected to the internal node of the second branch.

4. The circuit according to claim 1, wherein a control terminal of the reference transistor is connected to a control terminal of the second transistor.

5. The circuit according to claim 1, wherein the current source is connected to a first terminal and a control terminal of the reference transistor.

6. The circuit according to claim 1, wherein a second terminal of the reference transistor is connected to the reference node of the first branch.

7. The circuit according to claim 1, wherein a control terminal of the first transistor is connected to a voltage control circuit and the current source is connected to a control block.

8. The circuit according to claim 1, wherein the first branch and the second branch are each arranged between a first power rail and a second power rail.

9. The circuit according to claim 8, wherein the reference element and a second terminal of the first transistor are connected to the first power rail, and the current source and a second terminal of the second transistor are connected to the second power rail.

10. The circuit according to claim 8, wherein the reference element comprises a mirror resistor, connected to the reference node of the first branch and to the first power rail.

11. The circuit according to claim 1, wherein the first transistor, the second transistor and the reference transistor are each an n-type metal-oxide-semiconductor transistor, a p-type metal-oxide-semiconductor transistor, a NPN bipolar transistor or a PNP bipolar transistor.

12. A driver block comprising at least one circuit arrangement according to claim 1.

13. A driver block comprising at least two circuit arrangements according to claim 1, wherein the first transistor, the second transistor and the reference transistor of a first one of the at least two circuit arrangements are each an n-type metal-oxide-semiconductor transistor or a NPN bipolar transistor, and the first transistor, the second transistor and the reference transistor of a second one of the at least two circuit arrangements are each a p-type metal-oxide-semiconductor transistor or a PNP bipolar transistor.

14. A method of driving a circuit arrangement, the method comprising:
- providing a current by a current source to a current mirror, wherein the current source is arranged in a first branch,
- employing the current mirror to mirror a current of the first branch in a second branch, wherein an internal node of the second branch is connected to an output terminal,
- employing a first transistor to pull the output terminal to a voltage level of a power rail, wherein
- the first transistor is arranged in the second branch,
- the internal node of the second branch is arranged between the current mirror and the first transistor,
- the current mirror comprises a reference transistor and a second transistor,
- a reference element is arranged in the first branch,
- a reference node of the first branch is arranged between the current mirror and the reference element), and
- a feedback resistor is arranged between the internal node of the second branch and the reference node.

15. The method according to claim 14, wherein a voltage control circuit connected to a control terminal of the first transistor is operated inverted with respect to a control block connected to the current source.

* * * * *